United States Patent
Plankl et al.

(10) Patent No.: US 6,213,495 B1
(45) Date of Patent: Apr. 10, 2001

(54) AIRBAG CONTROL DEVICE

(75) Inventors: Christian Plankl, Burgweinting; Ludwig Riederer, Thalmassing, both of (DE)

(73) Assignee: Siemens Atkiengesellschaft, Munich (DE)

( * ) Notice: Subject to any disclaimer, the term of this patent is extended or adjusted under 35 U.S.C. 154(b) by 0 days.

(21) Appl. No.: 09/272,963

(22) Filed: Mar. 19, 1999

Related U.S. Application Data

(63) Continuation of application No. PCT/DE97/01561, filed on Jul. 23, 1997.

(30) Foreign Application Priority Data

Sep. 19, 1996 (DE) .............................. 196 38 454

(51) Int. Cl.$^7$ .................................................. B60R 21/16
(52) U.S. Cl. ..................... 280/728.2; 280/727; 280/735
(58) Field of Search ................. 280/728.2, 735, 280/727, 731; 439/76.1; 361/736, 752, 753

(56) References Cited

U.S. PATENT DOCUMENTS

| | | | |
|---|---|---|---|
| 3,830,329 | * 8/1974 | Sumida | 180/91 |
| 4,811,168 | * 3/1989 | Chesnut et al. | 361/399 |
| 5,327,796 | * 7/1994 | Ernst et al. | 280/731 |
| 5,590,900 | * 1/1997 | Duran et al. | 280/728.2 |
| 5,706,181 | * 1/1998 | Dirmeyer et al. | 361/804 |
| 5,873,597 | * 2/1999 | Sim | 280/735 |

FOREIGN PATENT DOCUMENTS

| | | | |
|---|---|---|---|
| 990750 | * 6/1976 | (CA) | 280/735 |
| 2438842 | * 3/1975 | (DE) | 280/735 |
| 2813457 | * 10/1979 | (DE) | 280/735 |
| 82 15 442 | 9/1982 | (DE) . | |
| 3319724 | * 7/1986 | (DE) | 280/728.2 |
| 41 11 883 A1 | 10/1991 | (DE) . | |
| 44 06 499 C2 | 9/1995 | (DE) . | |
| 196 22 228 C1 | 6/1997 | (DE) . | |
| 195832 | * 10/1986 | (EP) | 280/735 |
| 444866 | * 9/1991 | (EP) | 280/735 |
| 2 728 847 | 7/1996 | (FR) . | |
| 4-342638 | * 11/1992 | (JP) | 280/735 |

OTHER PUBLICATIONS

Published German Patent Application No. G 72 40 694, dated Apr. 5, 1973, device for storing replacement spark plugs.

* cited by examiner

*Primary Examiner*—J. J. Swann
*Assistant Examiner*—James S. McClellan
(74) *Attorney, Agent, or Firm*—Herbert L. Lerner; Laurence A. Greenberg; Werner H. Stemer

(57) ABSTRACT

An airbag control device comprises a housing with a cover that enclose a printed circuit board with an acceleration sensor and electronic components. The housing and the cover have a substantially central passage, from which the housing interior is closed off. The substantially central passage has, at least in one region thereof, an asymmetrical shape that enables the control device to be installed with a single bolt having a shape complementary to that of the substantially central passage.

14 Claims, 4 Drawing Sheets

AIRBAG CONTROL DEVICE

CROSS-REFERENCE TO RELATED APPLICATION

This is a continuation of copending International Application PCT/DE97/01561, filed Jul. 23, 1997, which designated the United States.

BACKGROUND OF THE INVENTION

1. Field of the Invention

The invention relates to an airbag control device, and specifically to an airbag control device having a housing and a printed circuit board with electronic components disposed within an interior of the housing.

Electronic control devices providing personal protection in motor vehicles, such as airbags, seat-belt pre-tensioning systems etc., include a printed circuit board with various electronic components. The printed circuit board is enclosed by a housing provided with a cover, such as is described, for example, in German Patent DE 44 06 499 C2. For fastening the housing on the motor vehicle, the cover of the housing has fastening lugs or flanges which also fixes the orientation of the control device with respect to the motor vehicle. This fixed orientation of the control device is compulsory, since the acceleration sensor usually used has a predetermined direction of sensitivity. The printed circuit board is fastened to the housing by screws. To reduce radiation caused by long line routes, a screw is usually provided centrally on the housing as a discharging element.

SUMMARY OF THE INVENTION

It is accordingly an object of the invention to provide an airbag control device that allows simple, low-cost installation of the airbag control device in a motor vehicle, while minimizing vibration problems occurring in the region of the printed circuit board.

With the foregoing and other objects in view there is provided, in accordance with the invention, an airbag control device, comprising:

a housing having a cover and an interior formed therein;

a printed circuit board including electronic components, the printed circuit board disposed in the interior of the housing; and a substantially central passage for fastening the airbag control device to a motor vehicle and being closed off from the interior of the housing, the substantially central passage extending through the housing, the cover, and the printed circuit board.

In accordance with an added feature of the invention, a fastening part is provided; the substantially central passage is formed with an asymmetrical shape in at least one region thereof; and the fastening part has a region with a shape complementary to the asymmetrical shape of the substantially central passage for fixing a position of the airbag control device with respect to a position of the fastening part.

In accordance with an additional feature of the invention, a location adjacent the substantially central passage fastening the printed circuit board to the housing is provided.

In accordance with another feature of the invention, at least one further location fastening the printed circuit board to the housing is provided.

In accordance with a further feature of the invention, a screw fastening the printed circuit board to the housing and the cover at a further location is provided.

In accordance with again an added feature of the invention, the printed circuit board includes an acceleration sensor disposed between the substantially central passage and the further location.

In accordance with again an additional feature of the invention, the housing includes a support adjacent the central passage for restraining the printed circuit board.

In accordance with again another feature of the invention, the housing includes a support adjacent the substantially central passage for restraining the printed circuit board; and the cover has a shape that presses the printed circuit board against the support of the housing.

In accordance with again a further feature of the invention, the cover includes an outer supporting boarder; and an inner supporting boarder adjacent the substantially central passage that is lower than the outer supporting boarder.

In accordance with a further added feature of the invention, a mass bond attaches the cover, the housing, and the printed circuit board at the support of the housing.

In accordance with a further additional feature of the invention, the printed circuit board includes an acceleration sensor.

In accordance with yet another feature of the invention, a location adjacent the substantially central passage fastening the printed circuit board to the cover is provided.

In accordance with a concomitant feature of the invention, at least one further location fastening the printed circuit board to the cover is provided.

Using parts that can be produced at a low cost, for instance a diecast housing and a stamped sheet metal cover, the airbag control device according to the invention can be fastened on a vehicle body quickly with few fastening parts. Installation costs are also minimized. This is made possible, according to the invention, by providing only one central fastening location for the complete airbag control device, consequently only one fastening operation is required to attach the airbag control device to a motor vehicle. Prior art airbag control devices required, for example, four screws to attach the airbag control device to a motor vehicle. The invention saves at least two bolts and nuts, and consequently not only material, but also installation time.

By dispensing with previously customary fastening lugs, there is more space available for the control device itself, and the interior volume of the control device can be enlarged. The surface area of the printed circuit board can therefore be enlarged, so that a two-sided board population or a multilayer configuration is not necessary.

In addition, the central fastening location provides a central restraint for the printed circuit board. As a result, vibrations of the printed circuit board, which have disadvantageous effects on the vibration-sensitive electronic acceleration sensor, can be significantly reduced or even avoided. If appropriate, it is possible to dispense with encapsulation of the acceleration sensor, as is described in the above-mentioned German Patent DE 44 06 499 C2.

If a positive connection of the control device and the relevant fastening part with an asymmetrical form is provided, a torsionally secure and positionally exact installation of the control device in the motor vehicle is automatically obtained.

Other features which are considered as characteristic for the invention are set forth in the appended claims.

Although the invention is illustrated and described herein as embodied in an airbag control device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
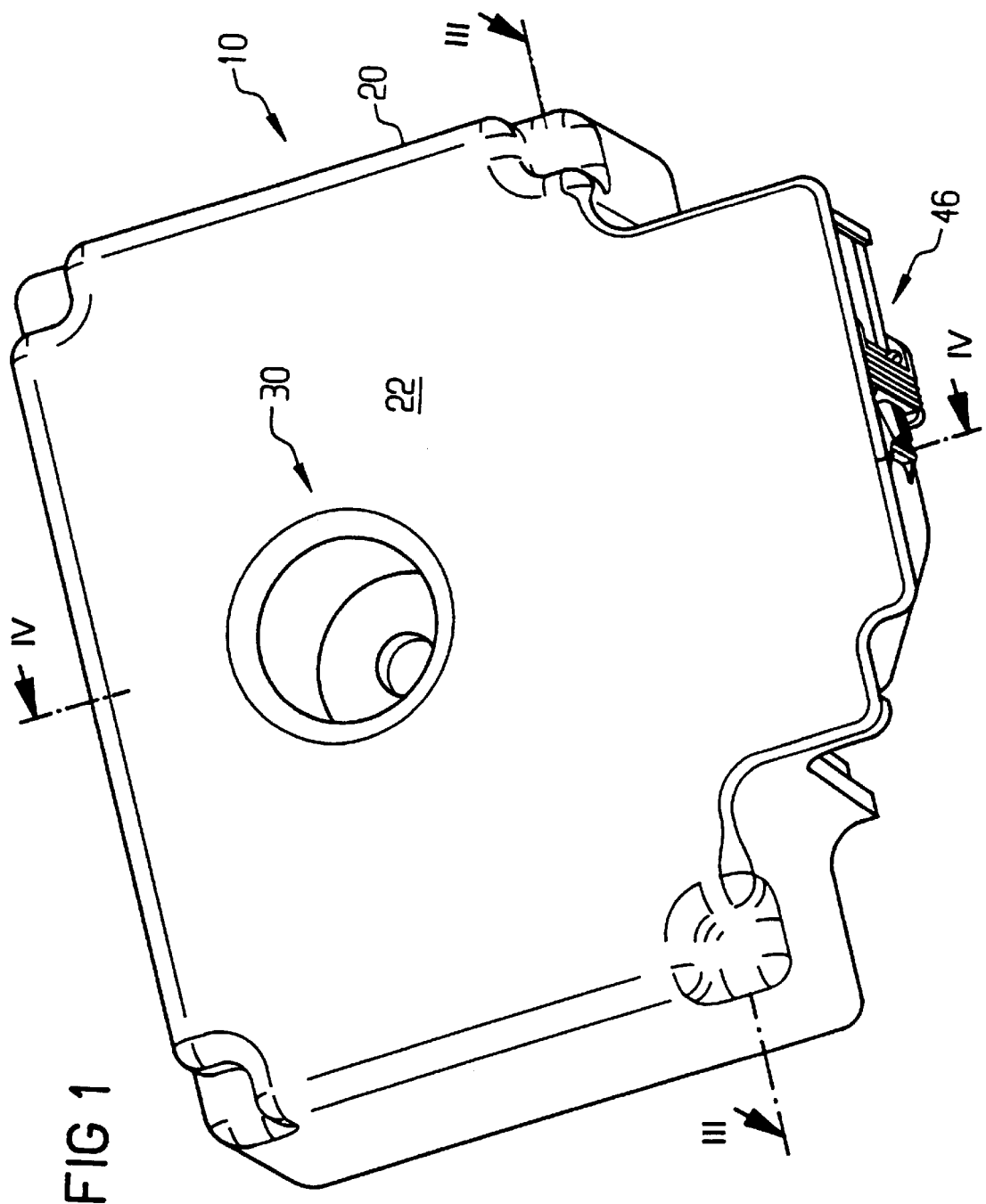
FIG. 1 is a perspective plan view of a base of a housing of an airbag control device.

Referring to FIGS. 1–5, in general, the invention is seen to be an airbag control device 10 which comprises a housing 20, for example, an aluminum diecast housing having a base 22 and side walls 24. A cover 26 (shown in FIGS. 2 and 3), for example, can be obtained from stamped sheet metal. Within the housing 20 is a printed circuit board 40 having an evaluation circuit with various components 42 and an acceleration sensor 44 connected to the evaluation circuit.

A plug-in connector 46 serves as the interface and connection with respect to the airbag and other control devices in the motor vehicle. The housing 20 has a central passage 30, with the base 22 of the housing 20 being drawn inward into the housing 20 and extending with formed-on parts through the housing 20 to the other outer side.

Figure 2:
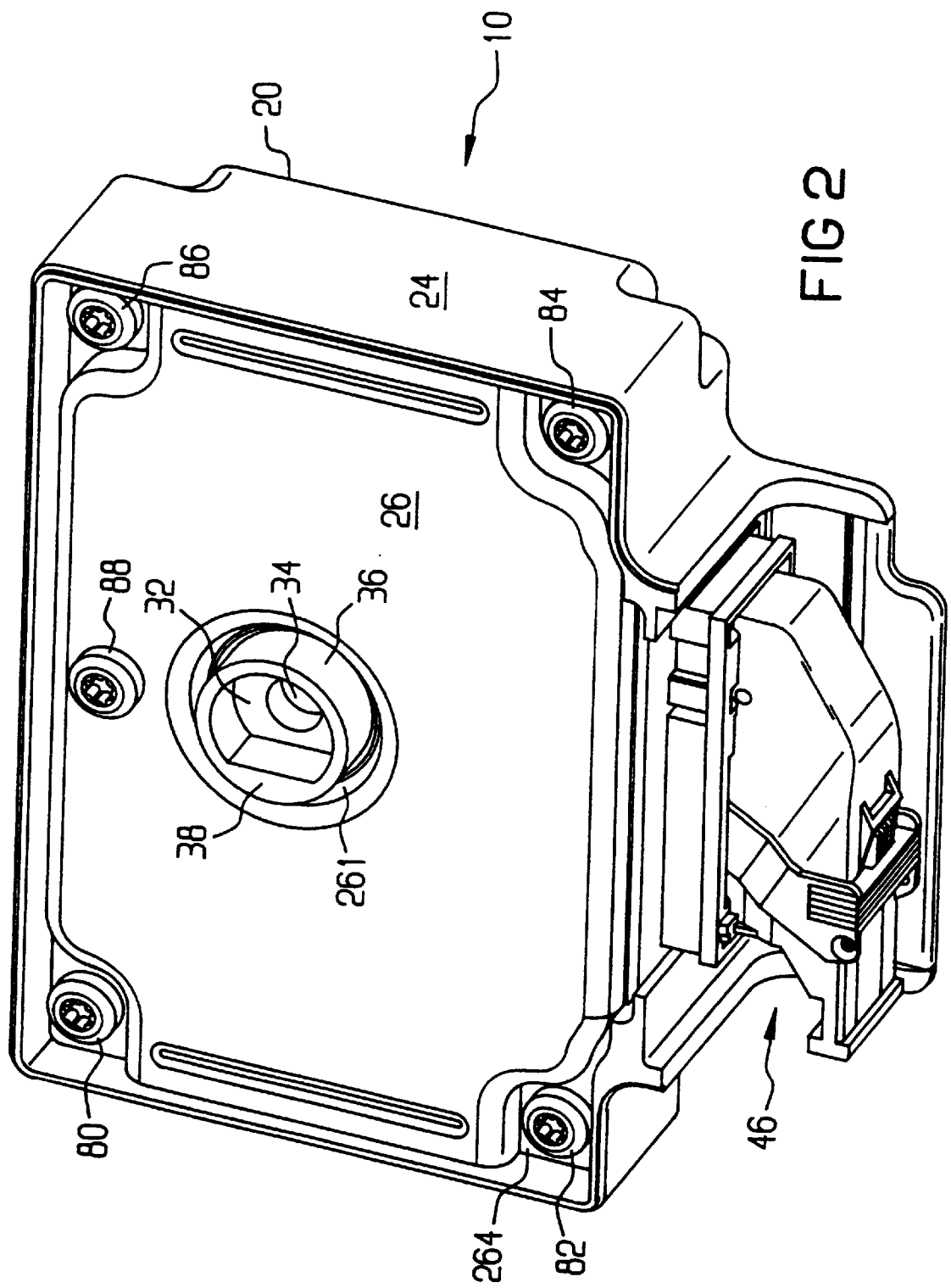
FIG. 2 is a perspective view of the housing showing a cover attached to the housing.
Figure 3:
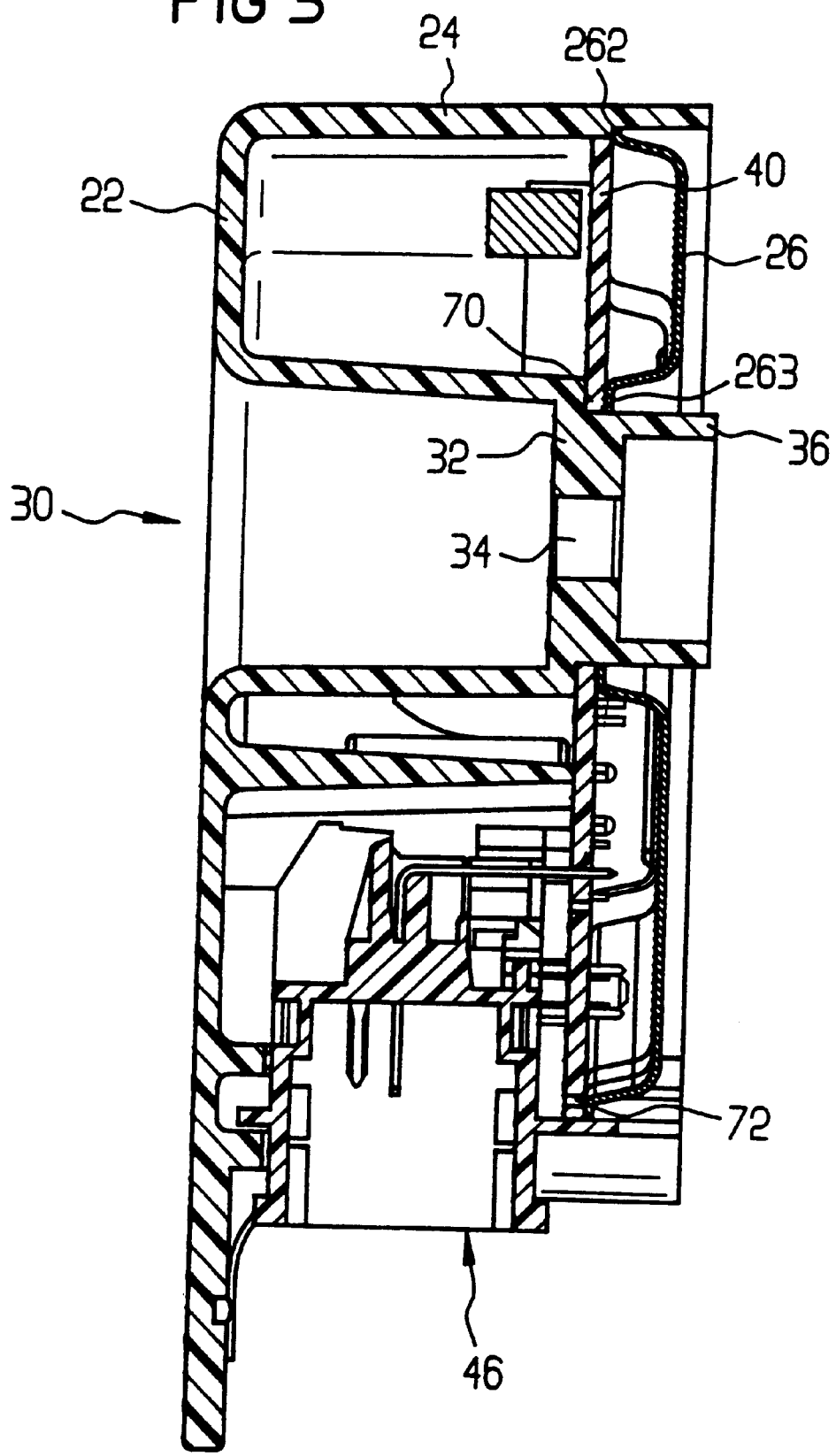
FIG. 3 is a sectional view taken along the line III—III shown in FIG. 1.

The base 22 of the housing 20 is bent inward in the center of the housing 20, so that it forms a blind hole having a blind-hole base 32 with a central opening 34. The blind-hole base 32 is approximately at the height of the printed circuit board 40 and has, on the inner side of the housing 20, a stepped portion extending to the end of the base 22 of the housing 20. The stepped portion forms a supporting shoulder 70 (shown in FIG. 3), the function of which will be explained later. The blind-hole base 32 is drawn up on the cover 26 to form a cylindrical ring 36, which protrudes beyond the cover 26 and the height of the side wall 24, as can be seen in FIG. 3. The cylindrical ring 36 is designed with an asymmetrical interior space, with the effect of forming a solid segment portion 38, which will likewise be explained later (See FIG. 2). The outside diameter of the cylindrical ring 36 is less than the diameter of the outer circumference of the blind-hole wall forming the passage 30. As the above description shows, the central passage 30 of the housing 20 is hermetically shielded from the housing interior.

The cover 26 has a central opening 261 and is drawn downward, i.e. toward the housing interior, in the region of the opening 261 and part of the outer edges, with the effect of forming supporting borders 262, 263. In the region of the corners, the supporting borders are widened to form fastening lugs 264 as shown in FIG. 2. The cover 26 is shaped in such a way that the inner supporting border 263 is lower than the outer supporting border 262 and the fastening lugs 264.

Figure 4:
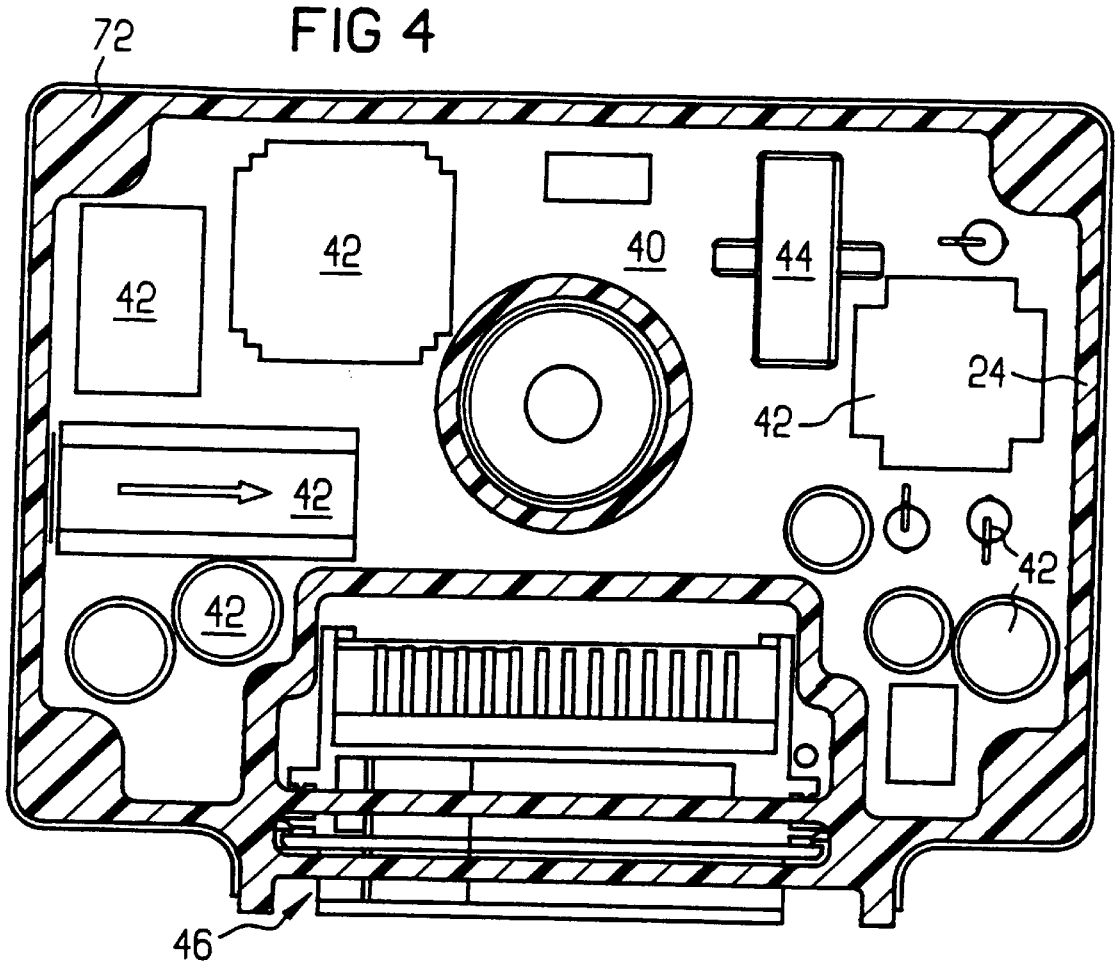
FIG. 4 is a sectional view taken along the line IV—IV shown in FIG. 1.

The side wall 24 of the housing 20 is drawn inward in the corner regions, at the height of the printed circuit board 40, with the effect of forming supporting shoulders 72, which are represented in FIG. 4. The cover 26 comes to lie on these supporting shoulders 72 in the region of the fastening lugs 264, as shown in FIG. 2.

The perspective view of FIG. 2 illustrates the assembly of the cover 26, printed circuit board 40 and housing 20 which are attached by four screws 80, 82, 84, 86. Alternatively, only three screws may be used, in which case, screws 80 and 86, are replaced with screw 88, which is additionally illustrated. The printed circuit board 40 is restrained in the center by the form of the cover 26 described and the centrally provided supporting shoulder 70. This dispenses with screws or other fastening means in the center for the printed circuit board 40 and prevents vibrations of the printed circuit board 40. By installing the acceleration sensor 44 closer to a restraining location of the printed circuit board 40, thus in the vicinity of the border, additional vibration protection of the acceleration sensor can be provided. The fastening and/or restraining of the printed circuit board 40 to the housing 20 or to the cover 26 in the region of the central passage 30 creates an additional supporting point at the center of the printed circuit board 40. Previously, this support at the center of the printed circuit board 40 necessitated providing an additional screw or a similar device. The central restraining location fixes the printed circuit board 40 in a central region, which would otherwise show a strong tendency to vibrate. The distances between fastening points allowing for oscillation are kept small on all sides by the central restraining location. The central restraining location also permits a mass bonding of the printed circuit board to the housing 20 and to the cover 26.

Figure 5:
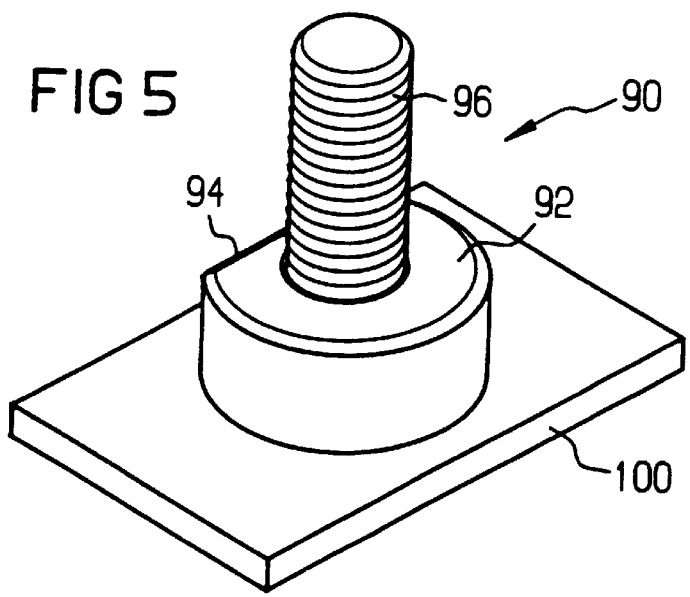
FIG. 5 is a perspective view of a threaded welding stud used for installation of the housing.

FIG. 5 illustrates a threaded welding stud 90, which is welded to the schematically indicated body panel 100 and has an asymmetrical head 92 with a segment relief 94 and a shank 96.

In the installation of the control device 10, i.e. the housing 20 with the attached cover 26, on the vehicle body, the cover 26 of the housing 20 is placed onto the shank 96 of the welding stud 90. Because of the positive engagement between the head 92 and the cylindrical ring 36, correct orientation of the control device 10 is guaranteed. On the opposite side, i.e. in the blind hole of the passage 30, it is then merely necessary to tighten a fastening nut onto the shank 96. The welding stud 90 provides fastening of the control device 10 onto the motor vehicle, and also serves as a discharging element for spurious radiation.

What is claimed is:

1. An airbag control device, comprising:
   a housing having a cover and an interior formed therein;
   a printed circuit board including electronic components, said printed circuit board disposed in said interior of said housing;
   a substantially central passage for fastening the airbag control device to a motor vehicle and being closed off from said interior of said housing, said substantially central passage extending through said housing, said cover, and said printed circuit board, whereby said housing and said cover are shaped to restrain said printed circuit board centrally around said central passage.

2. The airbag control device according to claim 1, further comprising:
   a fastening part; and wherein
   said substantially central passage has a keyed portion; and
   said fastening part has a region with a shape complementary to said keyed portion of said substantially central passage for fixing a position of the airbag control device with respect to a position of said fastening part.

3. The airbag control device according to claim 1, further comprising a location adjacent said substantially central passage fastening said printed circuit board to said housing.

4. The airbag control device according to claim 3, further comprising at least one further location fastening said printed circuit board to said housing.

5. The airbag control device according to claim 3, further comprising a screw fastening said printed circuit board to said housing and said cover at a further location.

6. The airbag control device according to claim 3, wherein said printed circuit board includes an acceleration sensor disposed between said substantially central passage and said further location.

7. The airbag control device according to claim 1, wherein said housing includes a support adjacent said central passage for restraining said printed circuit board.

8. The airbag control device according to claim 1, wherein:

said housing includes a support adjacent said substantially central passage for restraining said printed circuit board; and said cover has a shape that presses said printed circuit board against said support of said housing.

9. The airbag control device according to claim 8, wherein said cover includes an outer supporting boarder; and an inner supporting boarder adjacent said substantially central passage that is lower than said outer supporting boarder.

10. The airbag control device according to claim 1, wherein said printed circuit board includes an acceleration sensor.

11. The airbag control device according to claim 1, further comprising a location adjacent said substantially central passage fastening said printed circuit board to said cover.

12. The airbag control device according to claim 11, further comprising at least one further location fastening said printed circuit board to said cover.

13. The airbag control device according to claim 11, further comprising a screw fastening said printed circuit board to said housing and said cover at a further location.

14. The airbag control device according to claim 11, wherein said printed circuit board includes an acceleration sensor disposed between said substantially central passage and said further location.

* * * * *